(12) United States Patent
Kosmowski

(10) Patent No.: US 7,886,449 B2
(45) Date of Patent: Feb. 15, 2011

(54) FLEXURE GUIDE BEARING FOR SHORT STROKE STAGE

(75) Inventor: Mark T. Kosmowski, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 97 days.

(21) Appl. No.: 12/394,966

(22) Filed: Feb. 27, 2009

(65) Prior Publication Data
US 2009/0161238 A1 Jun. 25, 2009

Related U.S. Application Data

(63) Continuation-in-part of application No. 11/676,945, filed on Feb. 20, 2007, now Pat. No. 7,603,785.

(51) Int. Cl.
G01B 11/27 (2006.01)
G01B 7/02 (2006.01)

(52) U.S. Cl. .................. 33/286; 33/DIG. 21; 359/811

(58) Field of Classification Search .................. 33/1 M, 33/286, 503, 556, DIG. 21; 359/811
See application file for complete search history.

(56) References Cited

U.S. PATENT DOCUMENTS

| | | | |
|---|---|---|---|
| 3,988,063 A | 10/1976 | McNair et al. | |
| 4,667,415 A * | 5/1987 | Barsky | 33/1 M |
| 4,761,876 A | 8/1988 | Kosmowski | |
| 4,869,626 A | 9/1989 | Kosmowski | |
| 4,922,603 A | 5/1990 | Kosmowski | |
| 5,075,977 A * | 12/1991 | Rando | 33/DIG. 21 |
| 5,518,550 A | 5/1996 | Korenaga et al. | |
| 5,699,621 A | 12/1997 | Trumper et al. | |
| 5,942,871 A | 8/1999 | Lee | |
| 6,002,465 A | 12/1999 | Korenaga | |
| 6,359,677 B2 | 3/2002 | Itoh et al. | |
| 6,359,679 B1 | 3/2002 | Ito et al. | |
| 6,989,647 B1 | 1/2006 | Lee | |
| 7,308,747 B2 * | 12/2007 | Smith et al. | 33/568 |
| 7,478,481 B2 | 1/2009 | Reynaerts et al. | |
| 7,603,785 B2 * | 10/2009 | Kosmowski | 33/286 |
| 2001/0029675 A1 | 10/2001 | Webb | |
| 2005/0022401 A1* | 2/2005 | El-Katcha et al. | 33/293 |
| 2005/0086821 A1 | 4/2005 | Eichner et al. | |
| 2007/0062053 A1 | 3/2007 | Walser et al. | |
| 2007/0068020 A1 | 3/2007 | Adrian | |
| 2007/0263191 A1 | 11/2007 | Shibazaki | |
| 2007/0279768 A1* | 12/2007 | Shibazaki | 359/811 |
| 2008/0094593 A1 | 4/2008 | Shibazaki | |
| 2008/0196631 A1 | 8/2008 | Kosmowski et al. | |
| 2008/0198373 A1 | 8/2008 | Kosmowski et al. | |
| 2008/0198485 A1 | 8/2008 | Kosmowski | |

(Continued)

Primary Examiner—G. Bradley Bennett
(74) Attorney, Agent, or Firm—Young Basile

(57) ABSTRACT

A laser processing system in which a laser beam propagates along a beam axis and through a lens for incidence on a work surface of a target specimen mounted on a support. The lens forms a focal region of the laser beam. The support is operatively connected to a multiple-axis positioning system that moves the laser beam and the target specimen relative to each other to position the laser beam at selected locations on the work surface. An assembly includes at least one flexure that supports the lens and guides movement of the lens along the beam axis in response to a motive force to adjust the focal region of the laser beam relative to the work surface.

20 Claims, 7 Drawing Sheets

U.S. PATENT DOCUMENTS

2008/0209746 A1 9/2008 Tan et al.
2009/0122293 A1 5/2009 Shibazaki
2009/0219634 A1* 9/2009 Blanding et al. ............ 359/823
2009/0223072 A1* 9/2009 Morin et al. ................. 33/263

* cited by examiner

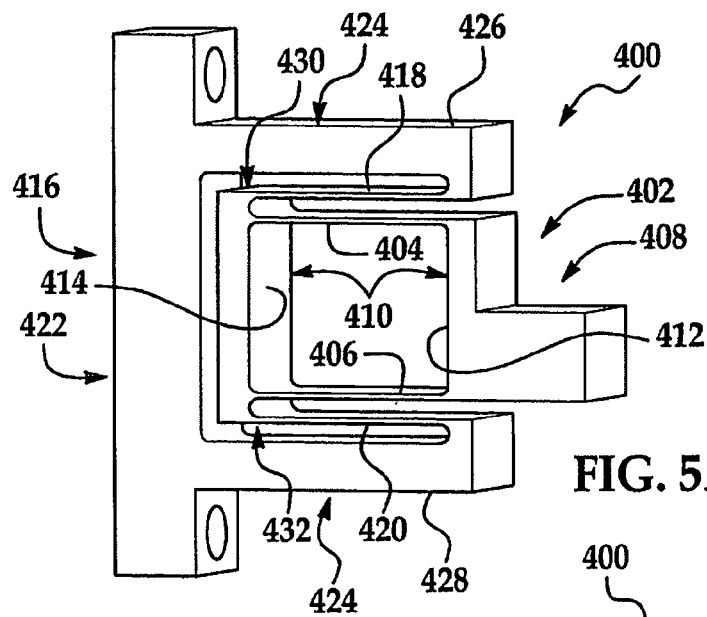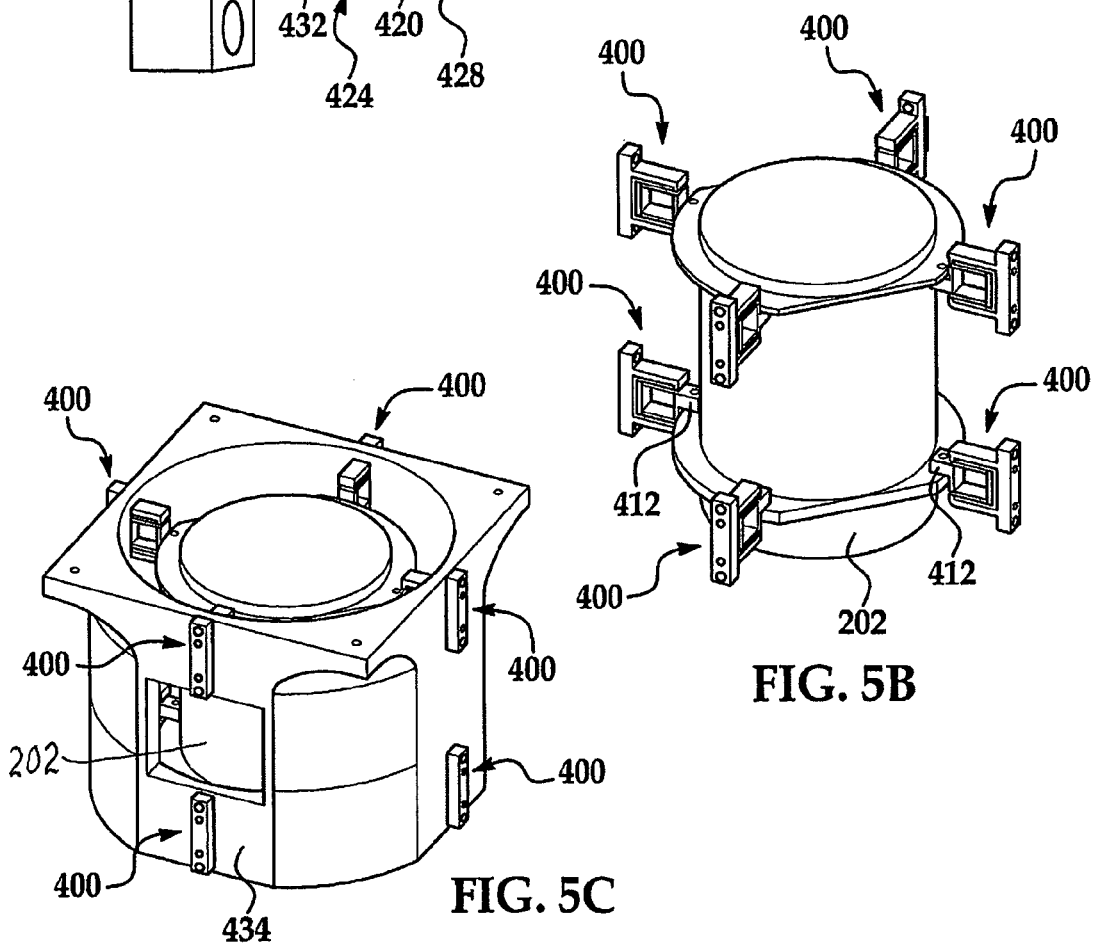
FIG. 5A
FIG. 5B
FIG. 5C

FLEXURE GUIDE BEARING FOR SHORT STROKE STAGE

CROSS-REFERENCE TO RELATED APPLICATIONS

This application is a Continuation In Part of U.S. patent application Ser. No. 11/676,945 filed on Feb. 20, 2007, which is incorporated by reference herein in its entirety.

FIELD OF THE INVENTION

The invention relates to a precision guiding of a short stroke (i.e. 6 millimeters (mm) of travel or less) stage with a laser focusing lens as the payload.

BACKGROUND

Wafer transport systems configured for use in semiconductor wafer-level processing typically include a stage having a chuck that secures the wafer for processing. Sometimes the stage is stationary, and sometimes it is moveable. Some applications require that the stage move linearly in one, two, or three Cartesian dimensions, with or without rotation. The speed of the stage motion can dictate the throughput of the entire wafer processing platform if a significant amount of the total process time is spent aligning and transporting the wafer.

For applications including optical processing, a moveable optics assembly can be mounted above the wafer surface, thereby minimizing the wafer transport distances required. The primary direction of stage motion is referred to as the "major axis," and the direction of stage motion perpendicular to the primary direction is referred to as the "minor axis." The chuck holding the wafer, or specimen, to be processed may be mounted to a major axis stage for movement along the major axis, a minor axis stage for movement along the minor axis, or in stationary position below the major and minor axes. The major axis stage may support the minor axis stage, or they may be independent of each other.

SUMMARY

Stage design of such optical systems is becoming more critical as electrical circuit dimensions shrink. One stage design consideration is the impact of process quality stemming from vibrational and thermal stability of the wafer chuck and optics assembly. In the case in which the laser beam position is continually adjusted, state-of-the-art structures supporting the laser assembly are too flexible to maintain the required level of precision. Moreover, as circuit dimensions shrink, particle contamination becomes of greater concern.

Conventional stage design employs the use of mechanical or air bearings that are designed for long stroke motion. Mechanical guide bearings have tremendous stiffness but the short stroke motions cause fret corrosion of the balls due to the lack of grease channeling during long term operation. Cage creep also caused problems with cross roller guides and die bushing guides, and friction tends to cause problems with controlling the stage as well. Air bearing guides are solutions to the problems with the above mentioned mechanical bearings but at the cost of stiffness. Air bearings do not have the stiffness that mechanical bearings possess.

Herein, a "split axis stage" architecture is implemented as a multiple stage positioning system that, in an embodiment, supports a laser optics assembly and a workpiece having a surface on which a laser beam is incident for laser processing. The multiple stage positioning system is capable of vibrationally and thermally stable material transport at high speed and rates of acceleration. A "split axis" design decouples driven stage motion along two perpendicular axes lying in separate, parallel planes. In an embodiment, motion in the horizontal plane is split between a specimen (major axis or lower) stage and a scan optics assembly (minor axis or upper) stage that move orthogonally relative to each other.

A dimensionally stable substrate in the form of granite, or other stone slab, or a slab of ceramic material, cast iron, or polymer composite material such as Anocast™, is used as the base for the lower and upper stages. The slab and the stages are preferably fabricated from materials with similar coefficients of thermal expansion to cause the system to advantageously react to temperature changes in a coherent fashion. The substrate is precisely cut ("lapped") such that portions of its upper and lower stage surfaces are flat and parallel to each other. In a preferred embodiment, a lower guide track assembly that guides a lower stage carrying a specimen-holding chuck is coupled to a lower surface of the substrate. An upper guide track assembly that guides an upper stage carrying a laser beam focal region control subsystem is coupled to an upper surface of the substrate. Linear motors positioned along adjacent rails of the guide track assemblies control the movements of the lower and upper stages.

The massive and structurally stiff substrate isolates and stabilizes the motions of the laser optics assembly and the specimen, absorbs vibrations, and allows for smoother acceleration and deceleration because the supporting structure is inherently rigid. The stiffness of the substrate and close separation of the stage motion axes result in higher frequency resonances, and less error in motion along all three axes. The substrate also provides thermal stability by acting as a heat sink. Moreover, because it is designed in a compact configuration, the system is composed of less material and is, therefore, less susceptible to expansion when it undergoes heating. An oval slot cut out of the middle of the substrate exposes the specimen below to the laser beam and allows for vertical motion of the laser optics assembly through the substrate. Otherwise, the specimen is shielded by the substrate from particles generated by overhead motion, except for the localized region undergoing laser processing.

A laser beam focal region control subsystem is supported above the lower stage and includes a vertically adjustable optics assembly positioned with respect to at least one flexure mounted to the upper stage by a support structure. The rigidity of the support structure allows for faster and more accurate vertical motion along the beam axis. The lens supporting sleeve acts as a support for connection to the flexure guiding the vertical motion of the focal region of the laser beam. Vertical motion is initiated by a lens forcer residing at the top end of the sleeve, which imparts a motive force to the optics assembly to adjust its height relative to the workpiece on the lower chuck, and in so doing, adjusts the focal region of the laser relative to the work surface. An isolation flexure device, rigid along the beam axis and compliant in the horizontal plane, buffers excess motion of the lens forcer from the optics assembly.

The split axis stage design is applicable to many platforms used in semiconductor processing including dicing, component trim, fuse processing, inking, printed wire board (PWB) via drilling, routing, inspection and metrology. The advantages afforded by such a design are also of benefit to a whole class of mechanical machining tools.

For stages that have a short stroke (e.g. 6 millimeter (mm) of travel or less), a flexure guide bearing is the best solution for guiding the stage due to the following characteristics: (1)

very high stiffness on all axes that are out of the plane of motion; (2) zero friction; (3) can be fabricated economically; (4) no external air supply needed; (5) no grease needed; and (6) no fret corrosion. By applying a twin beam flexure to a Z axis stage that carries a lens and/or cameras, it is possible to create a stage that has high stiffness without the problems and issues that mechanical bearings have. One particular embodiment can use a modular approach where multiple flexures of the same design are placed around the lens and work together as a group to guide the Z-axis motion. The flexures are mounted to the lens housing and are grounded to an outer housing.

Flexure stages have not previously been used for guiding motion and to support optical components, such as a laser lens and/or cameras, relative to specimen processing systems, and in particular, to stage architecture for control of two- or three-dimensional positioning of a processing device relative to a target specimen. Flexure stages have not previously been positioned in a parallel arrangement with respect to one another and/or used in a group where each flexure is configured identical to the other flexures.

Details of embodiments and applications of the present invention will become apparent to those skilled in the art when the following description is read in conjunction with the accompanying drawings.

BRIEF DESCRIPTION OF THE DRAWINGS

The description herein makes reference to the accompanying drawings wherein like reference numerals refer to like parts throughout the several views, and wherein:

FIG. 5A is a detailed view of a twin beam flexure according to one embodiment of the invention;

FIGS. 5B and 5C are an arrangement of flexures around a lens according to one embodiment of the invention;

DETAILED DESCRIPTION

Figure 1:
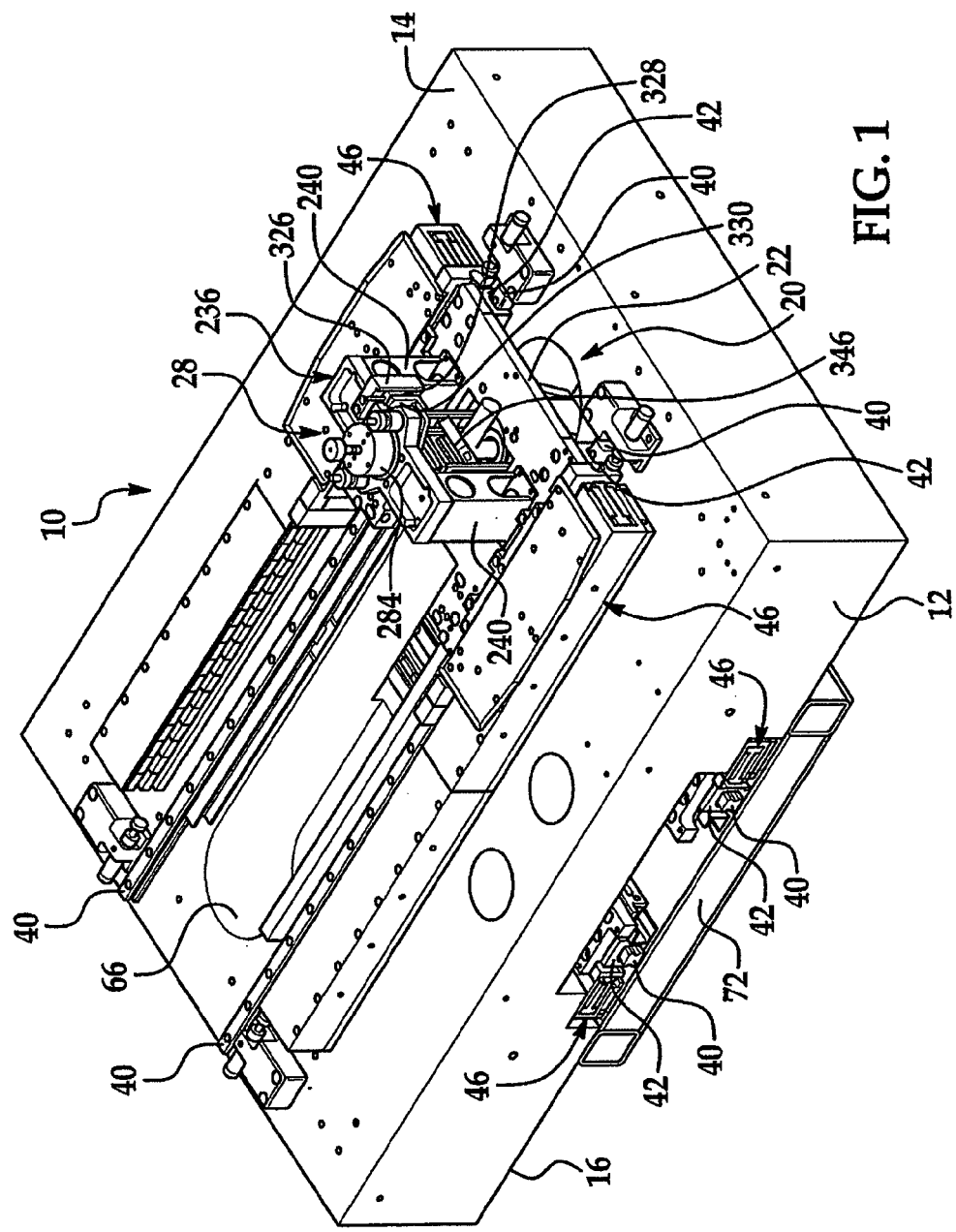
FIG. 1 is an isometric view of a decoupled, multiple stage positioning system.
Figure 2:
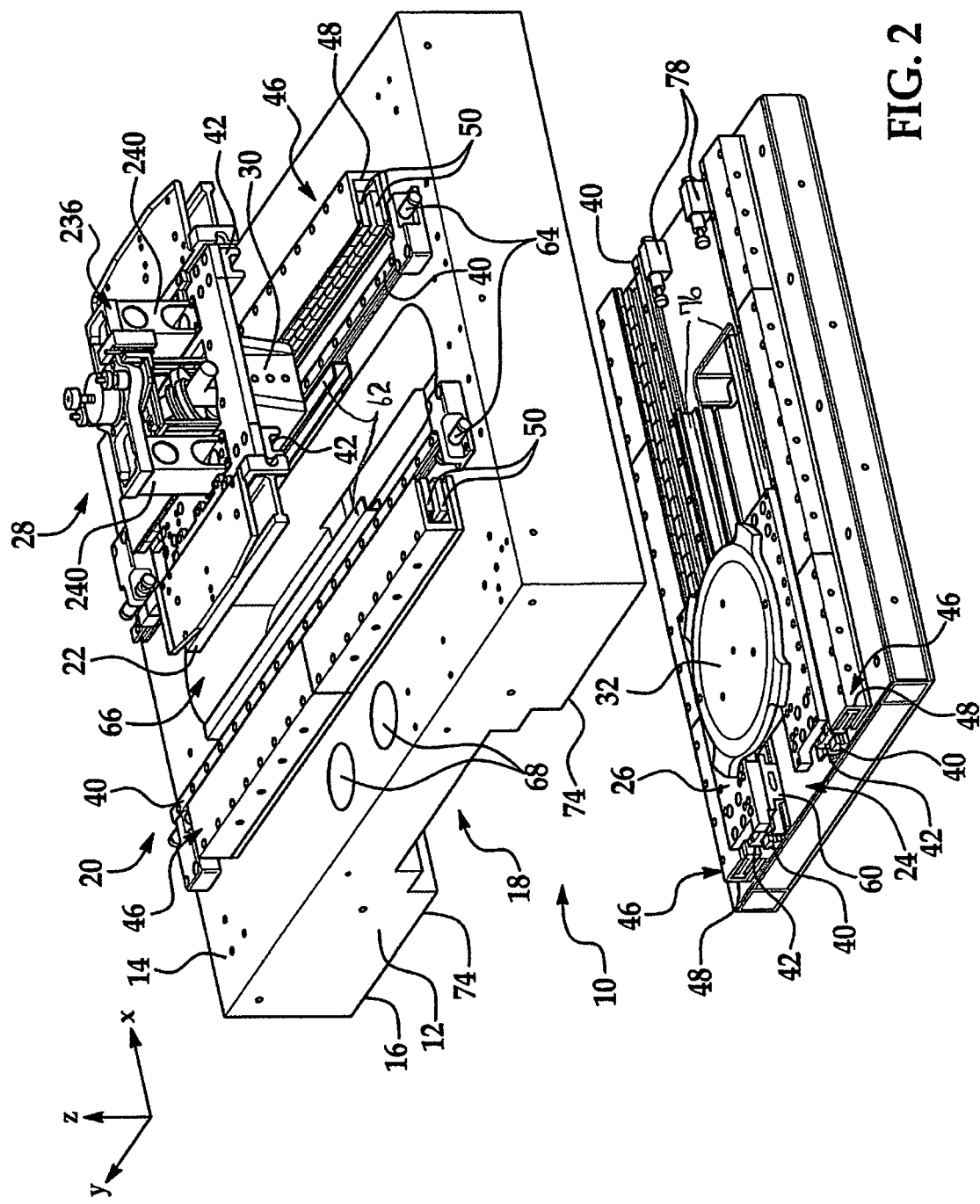
FIG. 2 is a partly exploded isometric view of the positioning system of FIG. 1, showing upper and lower stages that, when the system is assembled, are mounted to a dimensionally stable substrate such as a stone slab.

FIGS. 1 and 2 show a decoupled, multiple stage positioning system 10, which, in one embodiment, supports components of a laser processing system through which a laser beam propagates for incidence on a target specimen. Positioning system 10 includes a dimensionally stable substrate 12 made of a stone slab, preferably formed of granite, or a slab of ceramic material, cast iron, or polymer composite material such as Anocast™. Substrate 12 has a first or upper flat major surface 14 and a second or lower flat major surface 16 that has a stepped recess 18. Major surfaces 14 and 16 include surface portions that are planes extending parallel to each other and conditioned to exhibit flatness and parallelism within about a ten micron tolerance.

A surface portion of upper major surface 14 and a first guide track assembly 20 are coupled to guide movement of a laser optics assembly stage 22 along a first axis, and a surface portion of lower major surface 16 and a second guide track assembly 24 are coupled to guide movement of a specimen stage 26 along a second axis that is transverse to the first axis. Optics assembly stage 22 supports a laser beam focal region control subsystem 28, which includes a scan lens 30 that depends downwardly below lower major surface 16 of substrate 12. Specimen stage 26 supports a specimen-holding chuck 32. The guided motions of stages 22 and 26 move scan lens 30 relative to laser beam processing locations on a surface of a specimen (not shown) held by chuck 32.

In a preferred implementation, substrate 12 is set in place so that major surfaces 14 and 16 define spaced-apart horizontal planes, and guide track assemblies 20 and 24 are positioned so that the first and second axes are perpendicular to each other to thereby define respective Y- and X-axes. This split axis architecture decouples motion along the X- and Y-axes, simplifying control of positioning the laser beam and chuck 32, with fewer degrees of freedom allowed.

Figure 3:
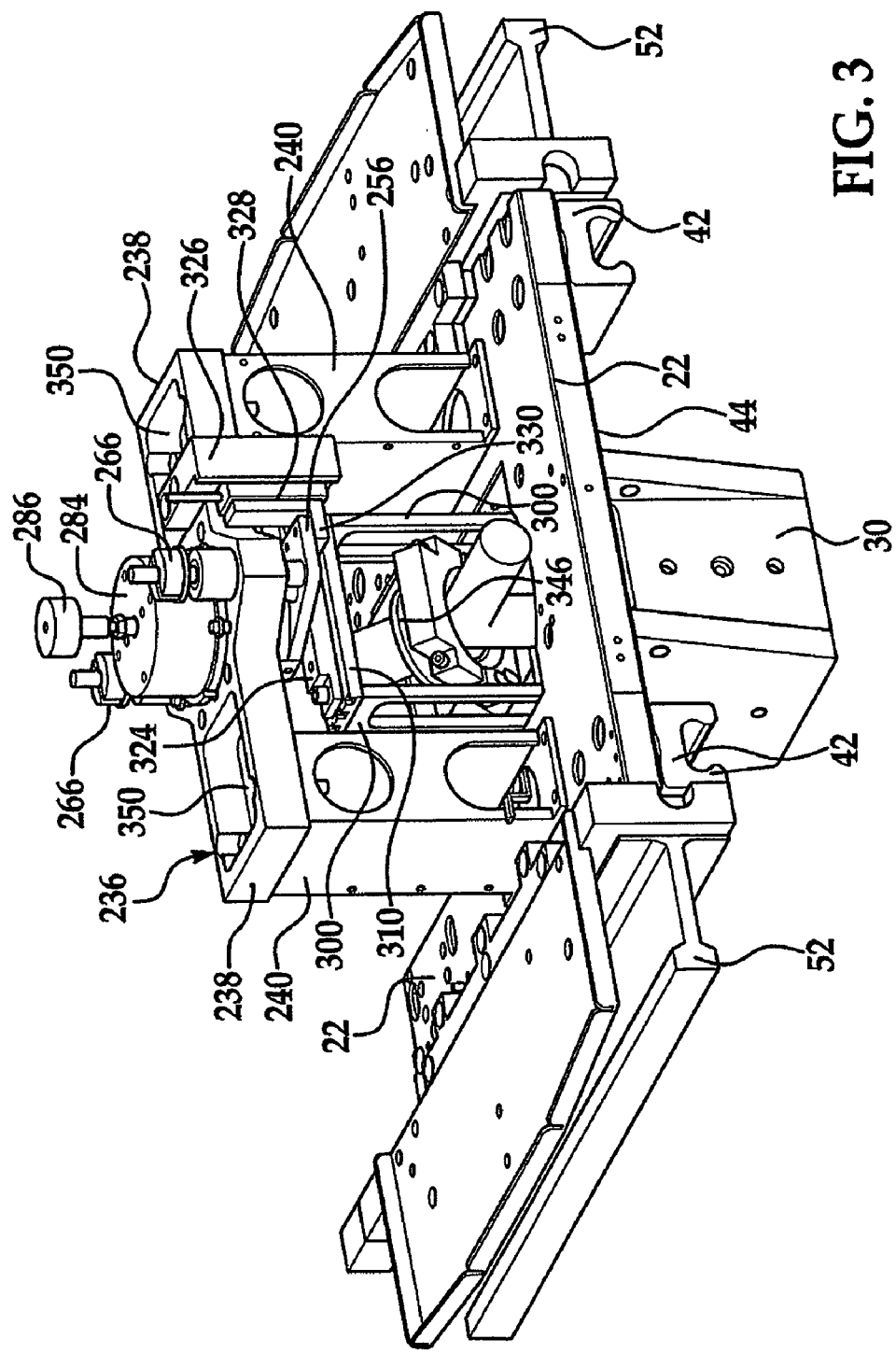
FIG. 3 is an isometric view of the positioning system of FIG. 1, showing the upper stage supporting a scan lens and upper stage drive components.

FIG. 3 shows in detail optics assembly stage 22, which operates with first guide track assembly 20 shown in FIG. 2. First guide track assembly 20 includes two spaced-apart guide rails 40 secured to support portions of upper major surface 14 and two U-shaped guide blocks 42 supported on a bottom surface 44 of optics assembly stage 22. Each one of guide blocks 42 fits over and slides along a corresponding one of rails 40 in response to an applied motive force. A motor drive for optics assembly stage 22 includes a linear motor 46 that is mounted on upper major surface 14 and along the length of each guide rail 40. Linear motor 46 imparts the motive force to propel its corresponding guide block 42 for sliding movement along its corresponding guide rail 40. Each linear motor 46 includes a U-channel magnet track 48 that holds spaced-apart linear arrays of multiple magnets 50 arranged along the length of guide rail 40. A forcer coil assembly 52 positioned between the linear arrays of magnets 50 is connected to bottom surface 44 of optics assembly stage 22 and constitutes the movable member of linear motor 46 that moves optics assembly stage 22. A suitable linear motor 46 is a Model MTH480, available from Aerotech, Inc., Pittsburgh, Pa.

Each rail guide 40—guide block 42 pair of first guide track assembly 20 shown in FIG. 2 is a rolling element bearing assembly. Alternatives for guide track assembly 20 include a flat air bearing or a vacuum preloaded air bearing. Use of either type of air bearing entails removal of each guide rail 40, exposing the surface portions of upper surface 14 to form guide surfaces, and substitution for each guide block 42 the guide surface or bearing face of the bearing, which is attached to bottom surface 44 of laser optics assembly stage 22. Vacuum preloaded air bearings, which have a pressure port and a vacuum port, hold themselves down and lift themselves off the guide surface at the same time. Use of vacuum preloaded air bearings needs only one flat guide surface; whereas use of opposed bearing preloading needs two flat, parallel guide surfaces. Suitable air bearings are available from New Way Machine Components, Inc., Aston, Pa. Thus, depending on the type of guide track assembly used, surface portions of upper major surface 14 may represent a guide rail mounting contact surface or a bearing face noncontacting guide surface.

A pair of encoder heads 60 secured to bottom surface 44 of optics assembly stage 22 and positioned adjacent different ones of guide blocks 42 includes position sensors that measure yaw angle and distance traveled of optics assembly stage 22. Placement of the position sensors in proximity to guide rails 40, guide blocks 42 and linear motors 46 driving each of stages 22 and 26 ensures efficient, closed-loop feedback control with minimal resonance effects. Limit switches included in encoder heads 60 are tripped by a magnet (not shown) attached to substrate 12. A pair of dashpots 64 dampens and stops the motion of optics assembly stage 22 to prevent it from overtravel movement off of guide rails 40.

An oval slot 66 formed in substrate 12 between and along the lengths of guide rails 40 provides an opening within which scan lens 30 can travel as optics assembly stage 22 moves along guide rails 40. A pair of through holes 68 formed in the region of stepped recess 18 in substrate 12 provides operator service access from upper surface 14 to encoder heads 60 to maintain their alignment.

Figure 4:
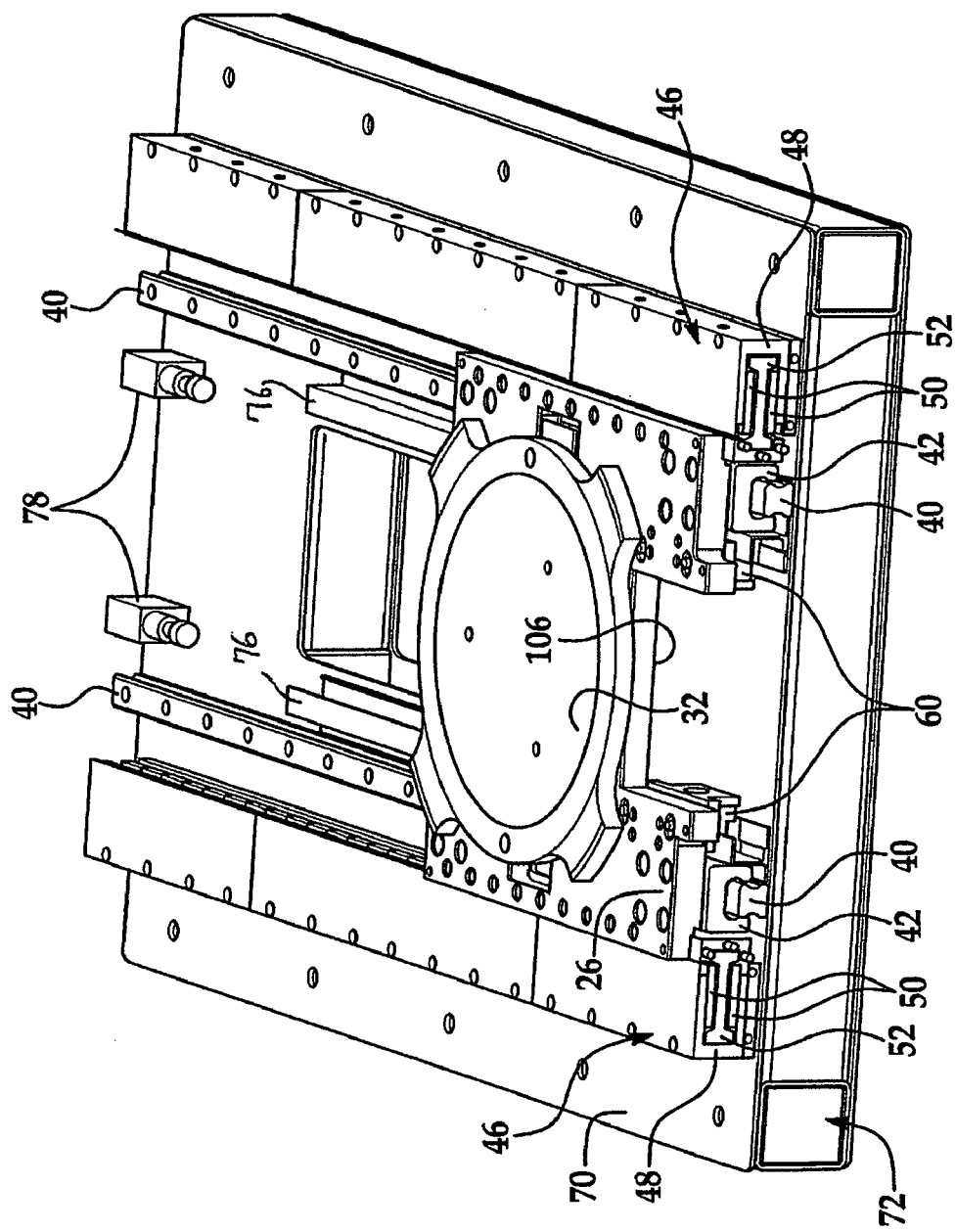
FIG. 4 is an isometric view of the positioning system of FIG. 1, showing the lower stage supporting a specimen-holding chuck and lower stage drive components.

FIG. 4 shows in detail specimen stage 26 in operative association with second guide track assembly 24 of FIG. 2. Second guide track assembly 24 includes guide rails, U-shaped guide blocks, linear motors, U-channel magnet tracks, magnets, forcer coil assemblies, and encoder heads that correspond to and are identified by the same reference numerals as those described above in connection with first guide track assembly 20. Linear motors 46 and the components of and components supported by second guide track assembly 24 are mounted on a surface 70 of a specimen stage bed 72.

The mechanical arrangement of stages 22 and 26 and motors 46 results in reduced pitch and roll of stages 22 and 26, and enhances accuracy of high velocity motion. Symmetric placement of motors 46 on opposite sides of stages 22 and 26 improves control of yaw. The placement of motors 46 along the sides of stages 22 and 26, as opposed to underneath them, minimizes thermal disturbance of critical components and position sensors.

Second guide track assembly 24 and specimen stage 26 supporting chuck 32 fits into and is secured within stepped recess 18. Surface 70 of specimen stage bed 72 is secured against a surface portion 74 of lower major surface 16 adjacent the wider, lower portion of stepped recess 18, and chuck 32 is positioned below the innermost portion of stepped recess 18 of lower major surface 16 and moves beneath it in response to the motive force imparted by linear motors 46 moving specimen stage 26 along second guide track assembly 24. Limit switches included in encoder heads 60 are tripped by a magnet (not shown) attached to substrate 12. A pair of dashpots 78 dampens and stops the motion of specimen stage 26 to prevent it from overtravel movement off of guide rails 40.

A first alternative to guide track assembly 24 is a magnetic preloaded air bearing using specimen stage bed 72 as a bearing land or guideway. Use of a magnetic preloaded air bearing entails removal of each guide rail 40, exposing the surface portions of specimen stage bed 72, and the removal of each guide block 42, providing on the bottom surface of specimen stage 26 space for mounting the air bearing with its (porous) bearing face positioned opposite the exposed surface portion.

Referring now to FIG. 5A, a twin beam flexure 400 according to one embodiment of the invention is illustrated in detail. Each of the at least one flexures 400 can include a twin beam portion 402 of the flexure 400 having at least one set of first and second parallel elongate horizontally extending beams 404, 406 of reduced vertically extending cross sectional area. Each set of parallel elongate beams 404, 406 allows movement in a Z axis direction, corresponding to the beam axis 206 of the laser beam 348, in response to the motive force.

Each of the at least one flexures 400 can include a support portion 408 having at least one set 410 of first and second vertically extending elongate support members 412, 414 of enlarged cross sectional areas respectively. The first and second support members 412, 414 connect to one another with the first and second parallel elongate beams 404, 406 spaced vertically from one another and extending between the first and second support members 412, 414. The first and second parallel elongate beams 404, 406 allow movement in a Z axis direction, corresponding to the beam axis 206 of the laser beam 348 passing through a lens 30 forming a focal region of the laser beam 348 for incidence on a work surface of a target specimen mounted on a support 32, in response to a motive force. The first support member 412 can be connected to a housing or assembly 202 supporting the lens 30.

The at least one flexure 400 can include a second twin beam portion 416 having at least third and fourth parallel elongate horizontally extending beams 418, 420 of reduced vertically extending cross sectional area. Each set of parallel elongate beams 404, 406 and 418, 420 allow movement in a Z axis direction, corresponding to the beam axis 206 of the laser beam 348 passing through a lens 30 forming a focal region of the laser beam 348 for incidence on a work surface of a target specimen mounted on a support 32, in response to a motive force.

Figure 5D:
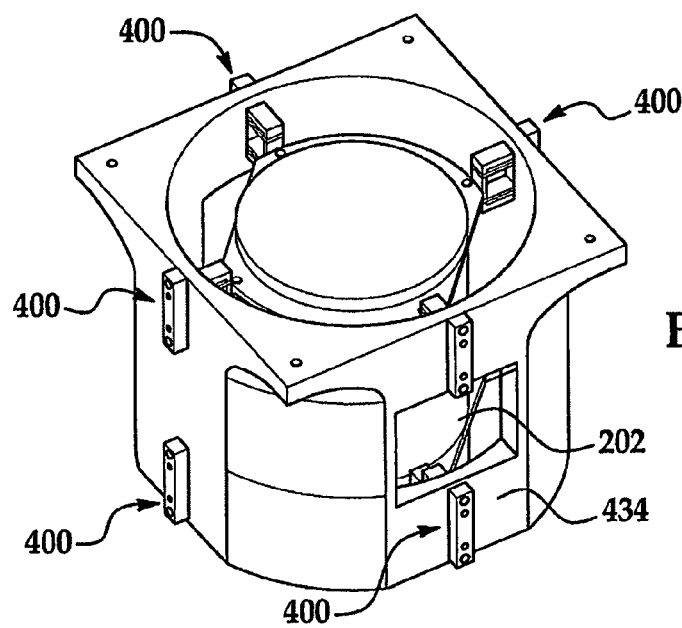
FIG. 5D is an assembly of a lens, flexure, and outer housing according to one embodiment of the invention.
Figure 5E:
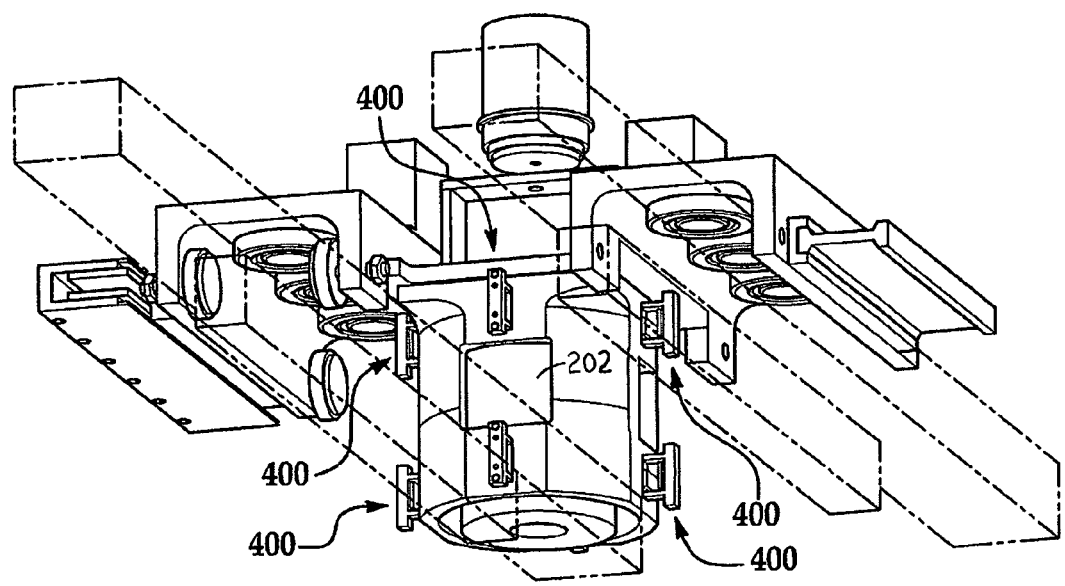
FIG. 5E is a simplified illustration of a Z axis assembly with flexures according to one embodiment of the invention.

The at least one flexure 400 can include a second support portion 422 having at least one set 424 of third and fourth support members 426, 428. The third and fourth support members can be vertically spaced, L-shaped configurations facing one another, and connected to one another through one of the beams 418, 420 extending from a corresponding one of the support members 426, 428, where each beam 418, 420 connects to an opposite end 430, 432 of the second support member 414 as best seen in FIG. 5A. The third and fourth support members 426, 428 can be connected to frame or support members 434 of the optics assembly stage 22 as best seen in FIGS. 5C and 5D.

Figure 6:
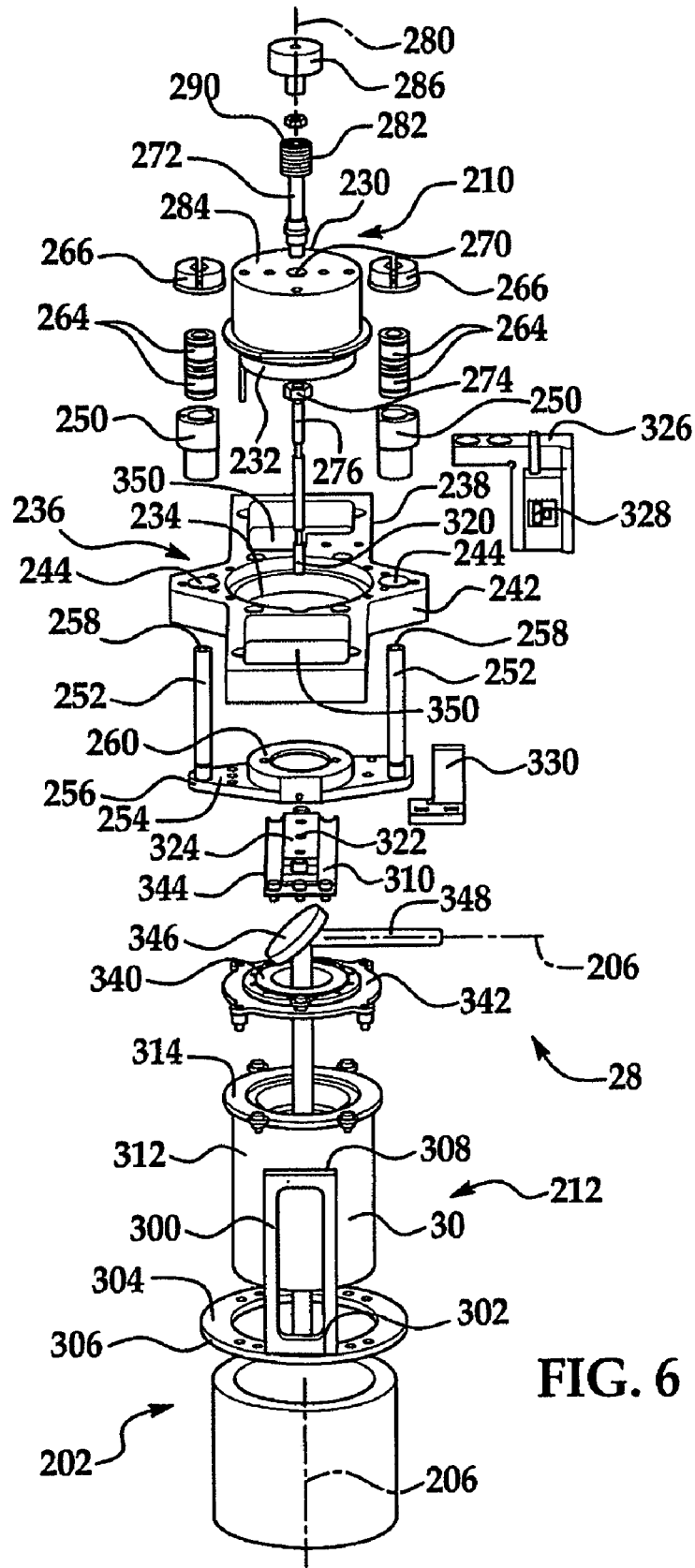
FIG. 6 is an exploded view of a preferred embodiment of a laser beam focal region control subsystem that includes an assembly housing a scan lens and at least one flexure guiding vertical (Z-axis) motion.

Referring briefly to FIG. 6, a lens forcer assembly 210 can include a movable member 276 guided for movement along the beam axis 206 and operatively connected to the lens 30 to impart the motive force to move the lens 30 along the beam axis 206 and thereby adjust the focal region of the laser beam 348 relative to the work surface of a target specimen mounted on a support 32. The motive force can be provided by the lens forcer assembly 210, by way of example and not limitation, such as a voice coil actuator, to adjust the focal region of the laser beam 348 and to control movement of the lens 30 relative to the work surface of a target specimen mounted on a support 32.

Referring now to FIGS. 5B-5E and FIG. 6, in a laser processing system 10 in which a laser beam 348 propagates along a beam axis 206 and through a lens 30 for incidence on a work surface of a target specimen mounted on a support 32, the lens 30 forms a focal region of the laser beam 348 and the support 32 operatively connects to a multiple-axis positioning system 10 that moves the laser beam 348 and the target specimen relative to each other to position the laser beam 348 at selected locations on the work surface of the target specimen. An assembly 22 including at least one flexure 400 supports the lens 30 and guides movement of the lens 30 along the beam axis 206 in response to a motive force to adjust the focal region of the laser beam 348 relative to the work surface of the target specimen. The at least one flexure 400 can include in one embodiment a plurality of flexures 400, where each flexure 400 can be identical to the other flexures 400. The plurality of flexures 400 can be positioned in parallel vertically extending Z axis orientations on opposite sides of a housing 230 supporting the lens 30 and along X and Y axes extending horizontally perpendicular to one another. The plurality of flexures 400 can include more than one flexure 400 located on at least one common, parallel, vertically extending Z axis. In one embodiment, a pair of flexures 400 can be spaced vertically from one another with corresponding vertically spaced pairs of flexures 400 spaced at angular locations around the housing 230 with respect to the beam axis 206 of the laser beam 348. The vertically spaced pairs of flexures 400 can be spaced at approximately 90° with respect to one another around the housing 230 with respect to the beam axis 206 of the laser beam 348. The at least one flexure 400 can include a plurality of flexures 400 acting as a group to support the lens 30 against movement along X and Y axes extending in a horizontal plane and located perpendicular with respect to one another, while allowing short stroke movement along a parallel vertically extending Z axis with respect to the beam axis 206 of the laser beam 348.

FIG. 6 illustrates the components of control subsystem 28 and its mounting on laser optics assembly stage 22. The control subsystem 28 can include a lens forcer assembly 210 that is coupled by a yoke assembly 212 to scan lens 30 contained in the interior of assembly 202. Lens forcer assembly 210, which is preferably a voice coil actuator, imparts by way of yoke assembly 212 a motive force that moves scan lens 30 and thereby the focal region of the laser beam to selected positions along beam axis 206.

Voice coil actuator 210 includes a generally cylindrical housing 230 and an annular coil 232 formed of a magnetic core around which copper wire is wound. Cylindrical housing 230 and annular coil 232 are coaxially aligned, and annular coil 232 moves axially in and out of housing 230 in response to control signals (not shown) applied to voice coil actuator 210. A preferred voice coil device 210 is an Actuator No. LA 28-22-006 Z, available from BEI Kimco Magnetics, Vista, Calif.

Annular coil 232 extends through a generally circular opening 234 in a voice coil bridge 236 having opposite side members 238 that rest on uprights 240 (FIG. 1) mounted on laser optics assembly stage 22 to provide support for laser beam focal region control subsystem 28. Voice coil bridge 236 includes in each of two opposite side projections 242 a hole 244 containing a tubular housing 250 through which passes a rod 252 extending from an upper surface 254 of a guiding mount 256. Each rod 252 has a free end 258. Guiding mount 256 has on its upper surface 254 an annular pedestal 260 on which annular coil 232 rests. Two stacked, axially aligned linear ball bushings 264 fit in tubular housing 250 contained in each hole 244 of side projections 242 of voice coil bridge 236. Free ends 258 of rods 252 passing through ball bushings 264 are capped by rod clamps 266 to provide a hard stop of lower travel limit of annular coil 232 along beam axis 206.

Housing 230 has a circular opening 270 that is positioned in coaxial alignment with the center of annular coil 232, opening 234 of voice coil bridge 236, and the center of annular pedestal 260 of guiding mount 256. A hollow steel shaft 272 extends through opening 270 of housing 230, and a hexagonal nut 274 connects in axial alignment hollow steel shaft 272 and a flexible tubular steel member 276, which is coupled to yoke assembly 212 as further described below. Hexagonal nut 274 is positioned in contact with a lower surface 278 of annular coil 232 to drive flexible steel member 276 along a drive or Z-axis 280 in response to the in-and-out axial movement of annular coil 232. Hollow steel shaft 272 passes through the center and along the axis of a coil spring 282, which is confined between a top surface 284 of housing 230 and a cylindrical spring retainer 286 fixed at a free end 290 of hollow steel shaft 272. Coil spring 282 biases annular coil 232 to a mid-point of its stroke along Z-axis 280 in the absence of a control signal applied to voice coil actuator 210.

Yoke assembly 212 includes opposed yoke side plates 300 (only one shown) secured at one end 302 to a surface 304 of a yoke ring 306 and at the other end 308 to a multilevel rectangular yoke mount 310. Scan lens 30 formed with a cylindrical periphery 312 and having an annular top flange 314 fits in yoke assembly 212 so that top flange 314 rests on surface 304 of yoke ring 306. Scan lens 30 is contained in the interior of assembly 202, and is supported by one or more flexure members 400 (FIGS. 5A-5E). The implementation of flexure support members 400 to support assembly 202 increases the rigidity of scan lens 30 in the X-Y plane while allowing the scan lens 30 to move along the Z-axis in a very smooth, controlled manner.

Flexible steel member 276 has a free end 320 that fits in a recess 322 in an upper surface 324 of yoke mount 310 to move it along Z-axis 280 and thereby move scan lens 30 along beam axis 206. An encoder head mount 326 holding an encoder 328 and attached to voice coil bridge 236 cooperates with an encoder body mount 330 holding an encoder scale and attached to guiding mount 256 to measure, using light diffraction principles, the displacement of guiding mount 256 relative to voice coil bridge 236 in response to the movement of annular coil 232. Because flexible tubular steel member 276 is attached to annular coil 232, the displacement measured represents the position of scan lens 30 along beam axis 206.

A quarter-waveplate 340 secured in place on a mounting ring 342 is positioned between a lower surface 344 of rectangular yoke mount 310 and top flange 314 of scan lens 30. A beam deflection device 346, such as a piezoelectric fast steering mirror, attached to optics assembly stage 22 (FIG. 3) is positioned between rectangular yoke mount 310 and quarter-waveplate 340. Fast steering mirror 346 receives an incoming laser beam 348 propagating along beam axis 206 and directs laser beam 348 through quarter-waveplate 340 and scan lens 30. Quarter-waveplate 340 imparts circular polarization to the incoming linearly polarized laser beam, and fast steering mirror 346 directs the circularly polarized laser beam for incidence on selected locations of the work surface of a target specimen supported on specimen stage 26. When fast steering mirror 346 is in its neutral position, Z-axis 280, beam axis 206, and the propagation path of laser beam 348 are collinear. When fast steering mirror 346 is in operation, the propagation path of laser beam 348 is generally aligned with beam axis 206.

Flexible steel member 276 is rigid in the Z-axis direction but is compliant in the X-Y plane. These properties of flexible steel member 276 enable it to function as a buffer, isolating the guiding action of assembly 202 containing scan lens 30 from the guiding action of lens forcer assembly 210 that moves scan lens 30.

Lens forcer assembly 210 and assembly 202 have centers of gravity and are positioned along the Z-axis. Voice coil bridge 236 of lens forcer assembly 210 has two depressions 350, the depths and cross sectional areas of which can be sized to achieve the axial alignment of the two centers of gravity. Such center of gravity alignment eliminates moment arms in control system 28 and thereby helps reduce propensity of low resonant frequency vibrations present in known cantilever beam designs.

Several examples of possible types of laser processing systems in which positioning system 10 can be installed include semiconductor wafer or other specimen micromachining, dicing, and fuse processing systems. In a wafer dicing system, laser beam 348 moves along scribe locations on the wafer surface. In a wafer fuse processing system, a pulsed laser beam 348 moves relative to wafer surface locations of fuses to irradiate them such that the laser pulses either partly or completely remove fuse material.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. In a laser processing system in which a laser beam propagates along a beam axis and through a lens for incidence on a work surface of a target specimen mounted on a support, the lens forming a focal region of the laser beam and the support operatively connected to a multiple-axis positioning system that moves the laser beam and the target specimen relative to each other to position the laser beam at selected locations on the work surface, the improvement comprising:
   an assembly including at least one flexure that supports the lens and guides movement of the lens along the beam axis in response to a motive force to adjust the focal region of the laser beam relative to the work surface.

2. The laser processing system of claim 1, wherein the at least one flexure further comprises:
   a plurality of flexures, each flexure being identical to one another.

3. The laser processing system of claim 2, wherein the plurality of flexures are positioned on parallel vertically extending Z axis orientations on opposite sides of a housing supporting the lens and along X and Y axes extending horizontally perpendicular to one another.

4. The laser processing system of claim 1, wherein the at least one flexure further comprises:
   a plurality of flexures acting as a group to support the lens against movement along X and Y axes extending horizontally perpendicular to one another, while allowing short stroke movement along a vertically extending Z axis.

5. The laser processing system of claim 1, wherein the at least one flexure further comprises:
   a twin beam portion of the flexure having at least one set of first and second parallel elongate horizontally extending beams of reduced vertically extending cross sectional area, each set of parallel elongate beams allowing movement in a Z axis direction in response to the motive force.

6. The laser processing system of claim 5, wherein the at least one flexure further comprises:
   a support portion of the flexure having at least one set of first and second vertically extending elongate support members of enlarged cross sectional areas respectively, the first and second elongate support members connected to one another with the first and second parallel elongate beams spaced vertically from one another and extending between the first and second support members.

7. The laser processing system of claim 6, wherein the at least one flexure further comprises:
   a second twin beam portion of the flexure having at least third and fourth parallel elongate horizontally extending beams of reduced vertically extending cross sectional area, each set of parallel elongate beams allowing movement in a Z axis direction in response to the motive force.

8. The laser processing system of claim 7, wherein the at least one flexure further comprises:
   a second support portion of the flexure having at least one set of third and fourth support members of enlarged cross sectional area respectively, the third and fourth support members being vertically spaced, L-shaped configurations oriented in facing relationship with respect to one another, and connected to one another through one of the elongate beams extending from a corresponding one of the support members, where each beam connects to an opposite end of the second support member.

9. The laser processing system of claim 1 further comprising:
   a voice coil actuator providing the motive force to adjust the focal region of the laser beam and control movement of the lens relative to the work surface.

10. In a laser processing system in which a laser beam propagates along a beam axis and through a lens for incidence on a work surface of a target specimen mounted on a support, the lens forming a focal region of the laser beam and the support operatively connected to a multiple-axis positioning system that moves the laser beam and the target specimen relative to each other to position the laser beam at selected locations on the work surface, the improvement comprising:
   an assembly including at least one flexure supporting the lens and guiding movement of the lens along the beam axis in response to a motive force applied to the lens; and
   a lens forcer including a movable member guided for movement along the beam axis and operatively connected to the lens to impart the motive force to move the lens along the beam axis and thereby adjust the focal region of the laser beam relative to the work surface.

11. The laser processing system of claim 10, wherein the at least one flexure further comprises:
   a plurality of flexures, each flexure being identical to one another.

12. The laser processing system of claim 11, wherein the plurality of flexures are positioned on parallel vertically extending Z axis orientations on opposite sides of a housing supporting the lens and along X and Y axes extending horizontally perpendicular to one another.

13. The laser processing system of claim 10, wherein the at least one flexure further comprises:
   a plurality of flexures acting as a group to support the lens against movement along X and Y axes extending horizontally perpendicular to one another, while allowing short stroke movement along a vertically extending Z axis.

14. The laser processing system of claim 10, wherein the at least one flexure further comprises:
   a twin beam flexure having at least one set of first and second parallel beams extending in an X-Y plane allowing movement in a Z axis direction in response to the motive force.

15. The laser processing system of claim 14, wherein the at least one flexure further comprises:
   a support portion of the flexure having at least one set of first and second vertically extending elongate support members of enlarged cross sectional areas respectively, the first and second elongate support members connected to one another with the first and second parallel elongate beams spaced vertically from one another and extending between the first and second support members.

16. The laser processing system of claim 15, wherein the at least one flexure further comprises:
    a second twin beam portion of the flexure having at least third and fourth parallel elongate horizontally extending beams of reduced vertically extending cross sectional area, each set of parallel elongate beams allowing movement in a Z axis direction in response to the motive force.

17. The laser processing system of claim 16, wherein the at least one flexure further comprises:
    a second support portion of the flexure having at least one set of third and fourth support members of enlarged cross sectional area respectively, the third and fourth support members being vertically spaced, L-shaped configurations oriented in facing relationship with respect to one another, and connected to one another through one of the elongate beams extending from a corresponding one of the support members, where each beam connects to an opposite end of the second support member.

18. The laser processing system of claim 10, in which the lens forcer includes a voice coil actuator that controls the movement of the movable member.

19. The laser processing system of claim 10, further comprising:
    an isolation flexure device operating as a buffer between the lens forcer and the lens to isolate the guided movement of the movable member of the lens forcer from the guided movement imparted to the lens by the movable member of the lens forcer.

20. The laser processing system of claim 19, in which the isolation flexure device is rigid along the beam axis and is compliant in a plane transverse to the beam axis.

* * * * *